US008084512B2

(12) United States Patent
Wang et al.

(10) Patent No.: US 8,084,512 B2
(45) Date of Patent: Dec. 27, 2011

(54) WATER SOLUBLE PHOTOSENSITIVE POLYMIDE POLYMER, ITS PREPARATION AND PHOTORESIST CONTAINING THE SAME

(75) Inventors: Jen Fu Wang, Hsinchu (TW); Sheng Yen Wu, Hsinchu (TW); An Pang Tu, Hsinchu (TW); Kuen Yuan Hwang, Hsinchu (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 417 days.

(21) Appl. No.: 12/421,973

(22) Filed: Apr. 10, 2009

(65) Prior Publication Data

US 2010/0167208 A1 Jul. 1, 2010

(30) Foreign Application Priority Data

Dec. 30, 2008 (TW) ................................ 9715347 A

(51) Int. Cl.
*C08G 77/10* (2006.01)

(52) U.S. Cl. ........... 522/168; 525/434; 528/26; 562/453

(58) Field of Classification Search .................. 522/168; 525/434; 528/26; 562/453
See application file for complete search history.

(56) References Cited

U.S. PATENT DOCUMENTS 5,587,275 A 12/1996 Kato
6,025,113 A 2/2000 Kikkawa et al.

*Primary Examiner* — James J Seidleck
*Assistant Examiner* — Gregory Listvoyb
(74) *Attorney, Agent, or Firm* — Muncy, Geissler, Olds & Lowe, PLLC

(57) ABSTRACT

The present invention relates to a water soluble photosensitive polyimide polymer, preparation thereof and a photoresist composition containing the same. The water soluble photosensitive polyimide polymer is characterized by having repeat units represented by the following formula (I):

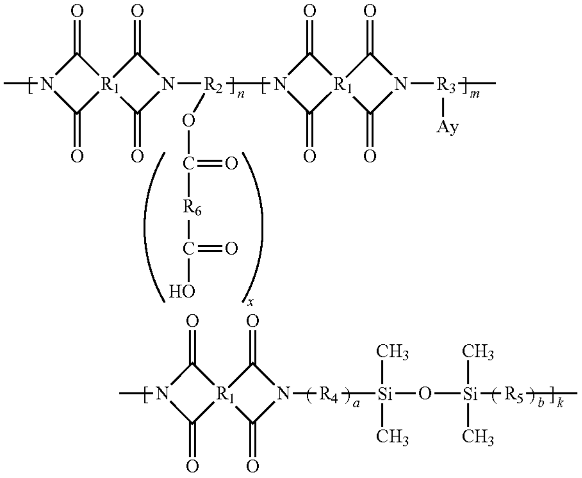

$[R_6 = -CR_7{=}CR_8-$,

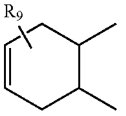

or

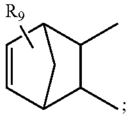

;

the other symbols are defined in the specification].

9 Claims, No Drawings

WATER SOLUBLE PHOTOSENSITIVE POLYMIDE POLYMER, ITS PREPARATION AND PHOTORESIST CONTAINING THE SAME

TECHNICAL FIELD

The present invention relates to a water soluble photosensitive polyimide polymer and its preparation. Particularly, the present invention relates to a water soluble photosensitive polyimide polymer showing good solubility in organic solvents and an aqueous alkaline solution, and having excellent heat-resistance, flexibility and insulating properties when forming into a film; thus it can be widely applied in electronic industries.

BACKGROUND ART

In process for producing semiconductors, the photolithography technology has been widely used in patterning circuits on substrates. In the photolithography technology, it requires using of photosensitive resins. Due to the photo-sensitivity of the resins, a printed circuit board having a desired pattern could be obtained by exposing the photosensitive resin to radiation through a patterned mask, developing, and removing the exposed part or the unexposed part with an aqueous alkaline solution.

Many kinds of photosensitive resins have been developed and used in the photolithography technology. For example, U.S. Pat. No. 5,587,275 disclosed a polyimide precursor which has a structure unit shown in the following formula (1):

(1)

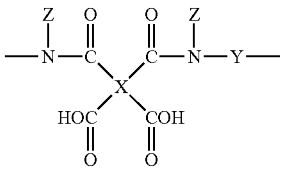

wherein X is a tetra-valence organic group having an aromatic ring; Y is a two-valence organic group having an aromatic ring; Z is a hydrogen atom or acryloyloxy or methacryloyloxy as shown in the following formula (2):

(2)

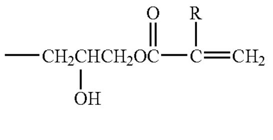

wherein R is a hydrogen atom or a methyl group.

In U.S. Pat. No. 5,587,275, a diamine is firstly reacted with (meth)acryl glycidyl ether to produce diamine monomer having acryloyloxy group, then the resultant diamine monomer is reacted with a tetra-carboxylic acid dianhydride to procure a polyimide precursor of the above formula (1).

Furthermore, in U.S. Pat. No. 6,025,113, it disclosed a polyimide precursor having repeat units of the following formula (3) and (4):

(3)

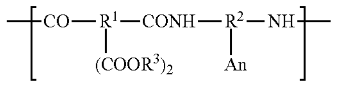

wherein $R^1$ is a tetra-valence organic group having 4 or more carbon atoms; $R^2$ is a three- or four-valence organic group having at least one aryl group; $R^3$ is a mono-valence organic group; A is an acidic mono-valence group; and n is 1 or 2;

(4)

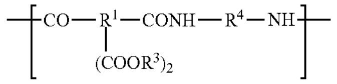

wherein $R^1$ is a tetra-valence organic group having 4 or more carbon atoms; $R^3$ is a mono-valence organic group; $R^4$ is a two-valence organic group having at least one aromatic ring or silicon atom.

In U.S. Pat. No. 6,025,113, the photo-resist sensitivity of polyimide precursor is increased through the formation of ester group between acryloyl and polyamic acid. The polyimide precursor is exposed and developed, finally cyclized at an elevated temperature to form a polyimide having superior heat-resistance and flexibility.

DETAILED DESCRIPTION OF THE INVENTION

The inventors have researched and developed a water soluble photo-sensitive polyimide resin, and investigated the functional groups on polyimide resin, and thus completed the present invention.

Accordingly, the present invention provides a water soluble photosensitive polyimide polymer, characterized in that it has repeating units as represented in the following formula (I):

(I)

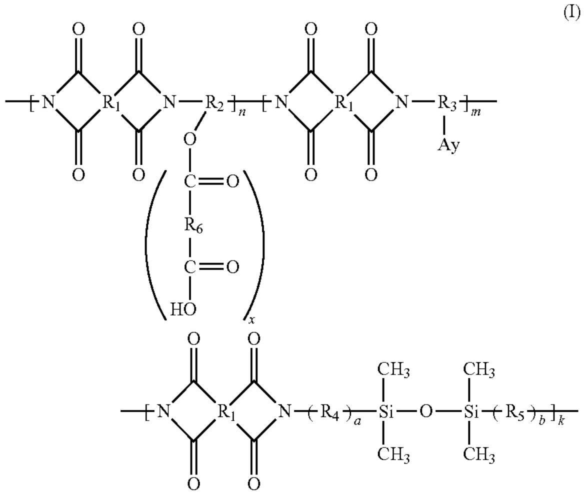

[wherein $R_6$ = $-CR_7=CR_8-$, 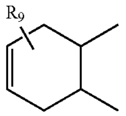 or 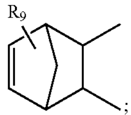;

$R_1$ represents a tetra-valence organic group having 4 or more carbon atoms; $R_2$ is a three- or tetra-valence organic group, which is optionally substituted with carboxyl group; $R_3$ represents a two- to tetra-valence organic group; A represents OH or COOH group; $R_4$ and $R_5$ are the same or different, each represents an alkylene group having 1~6 carbon atoms, an arylene group, arylalkylene group, arylene-oxy-alkylene group having 6~20 carbon atoms; $R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms; x represents an integer of 1 or 2; y represents an integer of 0, 1 or 2; a, b and n each represents an integer equal to or greater than 1; m and k each represents an integer equal to or greater than 0]; wherein the above repeating units are in random or block arrangement.

The weight-average molecular weight (Mw) of the water soluble photosensitive polyimide polymer of the present invention determined by gel permeation chromatography (GPC) converted into standard polystyrene is about 10,000~300,000, preferably 20,000~150,000, an intrinsic viscosity (IV) thereof is preferably 0.20~0.95, more preferably 0.60~0.85 and 5% thermal weight loss temperature in TGA (Td(95%)) is not less than 260° C., preferably not less than 300° C.

In the present invention, the intrinsic viscosity is determined by preparing a polymer solution with a polymer concentration of 0.5 g/dL by using N-methylpyridone (NMP) as a solvent, measuring the viscosity of the solution by Ubbelohode viscometer, and then calculating the inherent viscosity by the following equation:

$$\eta_{inh}=\ln(t/t0)/0.5\ (g/dl)$$

wherein t0=the time needed for the solvent (a blank) to pass two scale labels at upper and lower positions (in seconds)

t=the time needed for the polymer solution to pass two scale labels at upper and lower positions (in seconds)

In the present invention, the 5% thermal weight loss temperature in TGA (Td(95%)) is determined by using a thermogravimetry analyzer (TGA) and taken the temperature at which 5% by weight of the resin is lost.

The water soluble photosensitive polyimide polymer of the present invention has an excellent solubility in an aqueous alkaline solution, when it is coated into a film having a thickness of 10~25 μm, the resultant film (size: 9x5.5 cm) can be dissolved in 1000 ml 1 wt % sodium carbonate aqueous solution within 2 minutes, i.e. it shows a very good solubility in an aqueous alkaline solution.

The present invention also relates to a process for preparing the water soluble photosensitive polyimide polymer having repeating units represented by the formula (I):

(I)

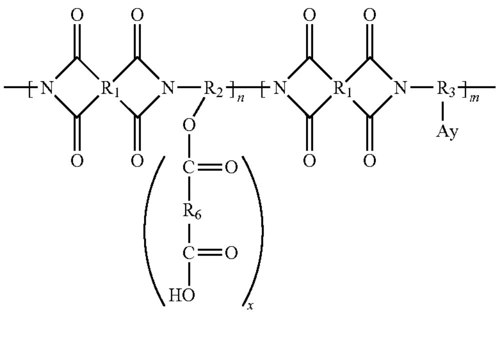

-continued

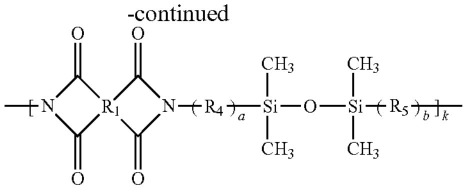

[wherein $R_6$ = $—CR_7=CR_8—$,

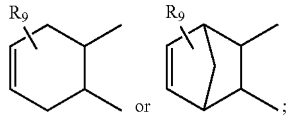

$R_1$ represents a tetra-valence organic group having 4 or more carbon atoms ; $R_2$ is a three- or tetra-valence organic group, which is optionally substituted with carboxyl group; $R_3$ represents a two- to tetra-valence organic group; A represents OH or COOH group; $R_4$ and $R_5$ are the same or different, each represents an alkylene group having 1~6 carbon atoms, an arylene group, arylalkylene group, arylene-oxy-alkylene group having 6~20 carbon atoms; $R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms; x represents an integer of 1 or 2; y represents an integer of 0, 1 or 2; a, b and n each represents an integer equal to or greater than 1; m and k each represents an integer equal to or greater than 0]; wherein the above repeating units are in random or block arrangement;

the process comprises the following steps:

(a) reacting a tetra-carboxyl acid dianhydride with a diamine having carboxyl and/or hydroxyl functional groups to obtain a polyamic acid precursor having carboxyl and/or hydroxyl functional groups in the main chain; wherein the molar ratio of tetra-carboxyl acid dianhydride diamine is 1:0.8~1:1.2;

(b) heating and subjecting the polyamic acid precursor having carboxyl and/or hydroxyl functional groups in the main chain obtained from step (a) to cyclization to obtain a polyimide having carboxyl and/or hydroxyl functional groups in the main chain; and (c) reacting the polyimide having carboxyl and/or hydroxyl functional groups in the main chain obtained from step (b) with a dianhydride of the following formula (II) to subject to open-ring reaction:

(II)

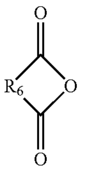

(wherein, $R_6$ = $—CR_7=CR_8—$,

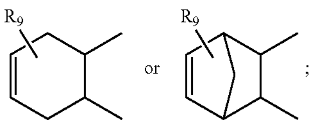

$R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms);

to produce a polyimide polymer having repeating unit which has acrylic acid group in the main chain, as shown in the above general formula (I).

In the process of the present invention, the diamine having carboxyl and/or hydroxyl functional groups used in above step (a) can use a diamine only having carboxyl functional group, a diamine only having hydroxy functional group, and a diamine having both carboxyl and hydroxyl functional groups. In case of that a diamine only having hydroxy functional group is used as the starting diamine, the resultant polymer represented by general formula (I) wherein A represents only OH is obtained. Moreover, by controlling the used amount of dianhydride (II) can control the m value, for example if the equivalent of carboxy group in dianhydride (II) is equal to that of the hydroxyl group in the diamine, m will become to be 0; and if the equivalent of hydroxyl group of the diamine is higher than that of carboxy group in dianhydride (II), m becomes to be larger than 0. In case of that a diamine having both hydroxy and carboxyl functional groups is used as the starting material, the resultant polymer represented by general formula (I) wherein A represents OH and COOH is obtained. By controlling the used amount of dianhydride (II) can control the m value, for example if the equivalent of dianhydride (II) is equal to that of the hydroxyl group in the diamine, m will become to be 0; and if the equivalent of hydroxyl group of the diamine is higher than that of dianhydride (II), m becomes to be larger than 0.

In the process of the present invention, the diamine having carboxyl and/or hydroxyl functional groups used in step (a) can be partially replaced by a diamine having siloxanyl functional group.

In the present invention, diamines having a siloxanyl functional group are following diamines:

(1)

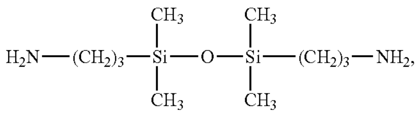

(2)

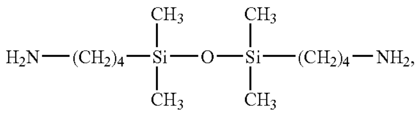

(3)

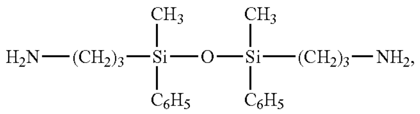

(4)

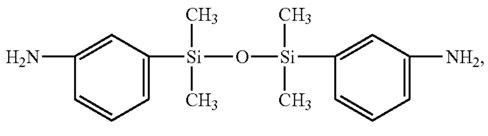

(5)

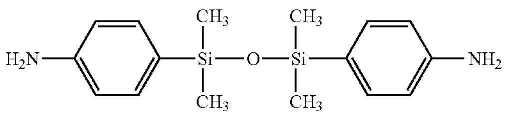

-continued (6)

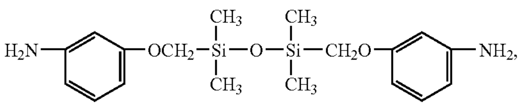

and (7)

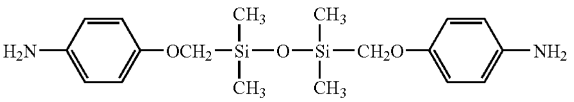

In the process of the present invention, in addition to the above mentioned diamine having carboxyl and/or hydroxyl functional groups and diamine having siloxanyl functional group, the diamine used in above step (a) can be mixed with a diamine generally used in preparing polyimide resin, if the performance desired for the final polyimide resin is not deteriorated.

In the process of the present invention, the condensation reaction in the step (a) is conducted under atmosphere pressure and at a temperature of from room temperature to 90° C., preferably from 30 to 75° C.; and the cyclization reaction in the step (b) is conducted at a temperature of from 60 to 190° C., preferably from 90 to 170° C.

In the step (a) of the present invention process, under the case of the diamine having carboxyl and/or hydroxyl functional groups partially replaced by the diamine having siloxanyl functional group, there is no particular restriction for the ratio between these two diamines, as long as the mole ratio of tetracarboxylic dianhydride to total amount of the diamine falls in the above specified range, however it is preferable that the content of the diamine having siloxanyl functional group is 5~60 mole %, more preferably 10~40 mole %, and most preferably 15~20 weight % based on the total diamine.

The polyimide polymer of the present invention can be used as a photoresist, and when it is coated on a substrate such as a copper substrate, then exposed, developed and baked, the resultant film does not shrink owing to the baking and its film thickness would not be reduced. Furthermore the polyimide polymer of the present invention shows a higher Td(95%) since the photosensitive functional group is linked directly on the main chain.

The present invention also relates to a soluble photosensitive polyimide resin composition comprising (A) a water soluble photosensitive polyimide resin having repeating units shown in the above formula (I); (B) (meth)acrylic acid monomer as a diluent; and (C) a photo-initiator, wherein the weight ratio of component (A): component (B) is 100:10~200, preferably 100:40~100. The content of component (C) photo-initiator is 0.1~15.0 weight %, preferably 1.0~5.0 weight %, based on 100 weight % of component (A).

DETAILED DESCRIPTION OF THE INVENTION

In the process for preparing the polyimide of the present invention, the tetra-carboxylic acid dianhydride used in step (a) is, for example but not limited to, 2,2'-di(3,4-di-carboxylphenyl)hexafluoropropane dianhydride (6FDA), pyromellitic dianhydride (PMDA), 4,4'-oxy-diphthalic anhydride (ODPA), 3,3',4,4'-biphenyltetracarboxylic dianhydride (BPDA), 3,3',4,4'-benzophenonetetracarboxylic dianhydride (BTDA), ethylene tetracarboxylic dianhydride, butane tetracarboxylic dianhydride, cyclopentanetetracarboxylic dianhydride, 2,2',3,3'-benzophenonetetracarboxylic dianhydride, 2,2',3,3'-biphenyl-tetracarboxylic dianhydride, 2,2-di(3,4-dicarboxylphenyl)propane dianhydride, 2,2-di(2,3-dicarboxylphenyl)propane dianhydride, di(3,4-dicarboxylphenyl)ether dianhydride, di(3,4-dicarboxylphenyl)sulfone dianhydride, 1,1-di(2,3-dicarboxylphenyl)ethane dianhydride, di(2,3-dicarboxylphenyl) methane dianhydride, di(3,4-dicarboxylphenyl) methane dianhydride, 4,4'-(p-phenyleneoxy)diphthalic dianhydride, 4,4'-(m-phenyleneoxy)diphthalic dianhydride, 2,3,6,7-naphthalene-tetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic acid dianhydride, 2,3,6,7-anthracene-tetracarboxylic dianhydride and 1,2,7,8-Phenanthrene-tetracarboxylic dianhydride, etc. These dianhydride can be used alone or as a mixture of more species.

In the process for preparing the polyimide of the present invention, the diamine having carboxyl and/or hydroxyl functional groups used in step (a) is, for example, but not limited to, 3,5-diaminobenzoic acid (DABZ), 3,3'-dihydroxy-4,4'-diaminobiphenyl etc.

In the process for preparing the polyimide of the present invention, the diamine having siloxanyl functional groups used in step (a) is, for example, but not limited to, 1,3-di(3-aminopropyl)-1,1,3,3-tetramethyl-disiloxane (DSI), 1,3-di(4-aminobutyl)-1,1,3,3-tetramethyldisiloxane, 1,3-di(3-aminopropyl)-1,3-dimethyl-1,3-diphenyldisiloxane, 1,3-di(3-aminophenyl)-1,1,3,3-tetramethyldisiloxane, 1,3-di(4-aminophenyl)-1,1,3,3-tetramethyldisiloxane, 1,3-di(3-aminophenoxymethyl)-1,1,3,3-tetramethyldisiloxane, 1,3-di(4-aminophenoxymethyl)-1,1,3,3-tetra-methyldisiloxane etc.

In step (a) of the process for preparing the polyimide of the present invention, in addition to the diamine having carboxyl and/or hydroxyl functional groups and the diamine having siloxanyl functional groups, suitable diamines are, for example p-phenylene diamine (PDA), 4,4'-oxydianiline (ODA), 1,3-di(4-aminophenoxy)-benzene (TPE-R), 2,2-bi[4-(4-aminophenoxy)phenyl]propane (BAPP), bi[4-(4-amino-phenoxy)phenyl]sulfone (BAPS), 1,3-di(3-aminophenoxy)benzene (APB), 4,4'-bi(4-aminophenoxy)-3,3'-dihydroxybiphenyl (BAPB), di[4-(3-aminophenoxy)phenyl]methane, 1,1-di[4-(3-amino-phenoxy)phenyl]-ethane, 1,2-di[4-(3-amino-phenoxy)phenyl]ethane, 2,2-di[4-(3-aminophenoxy) phenyl]propane, 2,2'-di[4-(3-aminophenoxy) phenyl]butane, 2,2-di[4-(3-amino-phenoxy)phenyl]-1,1,1,3,3,3-hexafluoropropane, 4,4'-di(3-aminophenoxy)biphenyl, di[4-(3-aminophenoxy)phenyl]ketone, di[4-(3-amino-phenoxy)phenyl]sulfide, di[4-(3-aminophenoxy)phenyl]-sulfoxide, di[4-(3-aminophenoxy)phenyl]sulfone, di[4-(3-amino-phenoxy) phenyl]ether etc. The above diamines can be used individually or as a mixture of more species.

In step (a) of the process for preparing the polyimide of the present invention, the reaction of dianhydride and diamine is carried out in an aprotic polar solvent, there is no special restriction on the aprotic polar solvent, as long as the solvent does not react with reactants or the product.

The embodiments of the suitable solvents are, for example, N,N-dimethylacetamide (DMAc), N-methylpyrrolidone (NMP), N,N-dimethylformamide (DMF), tetrahydrofuran (THF), dioxane, chloroform ($CHCl_3$), dichloromethane etc. Among them, N-methylpyrrolidone (NMP) and N,N-dimethylacetamide (DMAc) are preferable.

In step (a) of the process for preparing the polyimide of the present invention, the reaction of dianhydride and diamine is generally carried out at a temperature of from room temperature to 90° C., and preferably from 30 to 75° C.

In step (c) of the process for preparing the polyimide of the present invention, the examples of dianhydrides are, for examples, maleic anhydride, substituted maleic anhydride, tetrahydrophthalic anhydride, substitued tetrahydrophthalic anhydride, methylene-phthalic anhydride, and substitued methylenephthalic anhydride etc.

In the soluble photosensitive polyimide resin composition of the present invention, the component (B) (meth)acrylic acid monomer, in addition to serve as a diluent, can facilitate the curing of the composition upon exposure due to the vinyl functional group contained in the molecule. Examples of the (meth)acrylic acid monomer are, for example, but not limited to, ethylene glycol diacrylate, propylene glycol diacrylate, butylene glycol diacrylate, diethylene glycol diacrylate, dipropylene glycol diacrylate, trimethylolpropane triacrylate, triethylolpropane triacrylate, pentaerythritol diacrylate, dipentaerythritol triacrylate, ethylene glycol dimethacrylate, propylene glycol dimethacrylate, butylene glycol dimethacrylate, diethylene glycol dimethacrylate, dipropylene glycol dimethacrylate, trimethylolpropane trimethacrylate, triethylolpropane trimethacrylate, pentaerythritol dimethacrylate, and dipentaerythritol trimethacrylate etc.

When the polyimide resin of the present invention is formulated as a photoresist, a photoinitiator can be incorporated. The photoinitiator used in formulating the photoresist composition is a compound which molecular structure will decompose into free radicals, cation or anion active sites upon exposure of visiable light, ultra-violet light, far ultra-violet light, electron beam and X-ray, and induce the polymerization of the polyimide and the (meth)acrylate monomer.

Examples of the photoinitiators are, for example, but not limited to, imidazoles such as 2,2'-di(2-chlorophenyl)-4,4',5,5'-tetra(4-ethanoxy-carbonylphenyl)-1,2'-di-imidazole, 2,2'-di(2-bromophenyl)-4,4',5,5'-tetra(4-ethanoxy-carbonylphenyl)-1,2'-di-imidazole, 2,2'-di(2,4-dichloro-phenyl)-4,4',5,5'-tetraphenyl-1,2'-di-imidazole, 2,2'-di(2,4,6-trichloro-phenyl)-4,4',5,5'-tetraphenyl-1,2'-di-imidazole, 2,2'-di(2,4-dibromo-phenyl)-4,4',5,5'-tetraphenyl-1,2'-di-imidazole, and 2,2'-di(2,4,6-tribromophenyl)-4,4',5,5'-tetraphenyl-1,2'-di-imidazole.

Additional examples of the photoinitiators are, for example, phosphine oxides such as triphenylphosphine oxide (TPO, commercial available from BASF), di(2,4,6-trimethyl-benzoyl)phenylphosphine oxide [Irgacure 819, (IR819), commercial available from Ciba Geigy]; alkylphenyl ketones such as 1-hydroxycyclohexylphenyl ketone [Irgacure 184 (IR184), commercial available from Ciba Geigy], 2-methyl-(4-methylthienyl)-2-morpholinyl-1-propan-1-one [Irgacure 907(IR907), commercial available from Ciba Geigy] etc.

Other examples of the photoinitiators include benzoins photoinitiator, such as benzoin, benzoin methyl ether, benzoin ethyl ether, benzoin isopropyl ether, benzoin isobutyl ether, metyl-2-benzoylbenzoate, etc., and similar derivatives thereof.

Other examples of the photoinitiators also include acetophenones, such as 2,2-dimethoxy-2-acetophenone [Irgacure 651 (IR651), commercial available from Ciba Geigy], 2-hydroxy-2-methyl-1-phenylpropan-1-one, 1-(4-isopropylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-benzyl-2-dimethylamino-1-(4-morpholinylphenyl)butan-1-one, 2,2'-dimethoxy-1,2-diphenylethan-1-one, 4-azido-acetophenone, 4-azido-benzylidene acetophenone, etc., and similar derivatives thereof.

Another examples of the photoinitiators include benzophenone, 4,4'-di(dimethylamino)benzophenone, 4,4'-di(diethylamino)-benzophenone, 3,3'-dimethyl-4-methoxy benzophenone, etc., the like and similar derivatives thereof.

Further examples of the photoinitiators also include a photoinitiator with an α-diketone structure such as diacetoformate, dibenzoylformate, methylbenzoylformate, etc., and similar derivatives thereof; a photoinitiator with a multinuclear quinone structure such as anthraquinone, 2-ethylanthraquinone, 2-tertbutylanthraquinone, 1,4-naphthoquinone, etc., and similar derivatives thereof; a photoinitiator with a xanthone structure such as xanthone, thioxanthone, 2,4-diethylthioxanthone, 2-chlorothioxanthone, etc., and similar derivatives thereof; a photoinitiator with a diazo structure such as 4-diazodiphenylamine, 4-diazo-4'-methoxy-diphenylamine, 4-diazo-3-methoxydiphenyl-amine etc. and similar derivatives thereof; a photoinitiator with a triazine structure such as 2-(2'-furanyl-ethylidene)-4,6-di (trichloromethyl)-s-triazine, 2-(3',4'-dimethoxy-styryl)-4,6-di-(trichloromethyl)-s-triazine, 2-(4'-methoxynaphthyl)-4,6-di-(trichloromethyl)-s-triazine, 2-(2'-bromo-4'-methylphenyl)-4,6-di-(trichloromethyl)-s-triazine, 2-(2'-thienylethylidene)-4,6-di(trichloro-methyl)-s-triazine etc., and similar derivatives thereof.

These photoinitiators can be used alone or in a mixture of more than 2 species. The content of the photoinitiator is from 0.1~15.0 weight %, preferably 1.0~5.0 weight %, based on 100 weight % of component (A).

SYNTHESIS EXAMPLE

The present invention is described in detail below with reference to Synthesis Examples & Preparation Examples for purposes of exemplification and illustration only and not to limit the scope of the present invention.

Synthesis Example 1

41.05 g (0.1 mole) of 2,2'-di-[4-(4-aminophenoxy)phenyl]-propane (BAPP), 9.14 g (0.06 mole) of 3,5-diaminobenzoic acid (DABZ) and 350 g N-methylpyrrolidone (NMP) were added into a 1 liter glass reaction flask and vigorously stirred at room temperature. Into the reaction flask, 88,48 g (0.2 mole) of 2,2'-di(3,4-dicarboxyl-phenyl)hexafluoropropane dianhydride was added and stirred for 1 hour, then 8.43 g (0.039 mole) of 3,3'-dihydroxy-4,4'-diaminobiphenyl (HAP) was added, and stirred in room temperature for 3 hours. Thereafter 50 g of toluene was added and the temperature was increased to 150° C. to conduct an imidation (cyclization) reaction for 24 hours to obtain polyimide having OH group, then 3.92 g (0.04 mole) of maleic anhydride (MA) was introduced to continue the reaction at room temperature for 3 hours to obtain resin. Finally the resultant resin was poured into a large amount of methanol to precipitate out 136.2 g of polyimide polymer (PI-1) [yield: 90.01%, IV: 0.81, Td(95%): 340° C.].

Synthesis Example 2

15.215 g (0.1 mole) of 3,5-diaminobenzoic acid (DABZ) and 200 g of NMP were added into a 1 liter glass reaction flask and vigorously stirred at room temperature. 44.42 g (0.1 mole) of 2,2'-di(3,4-dicarboxyl-phenyl)-hexafluoropropane dianhydride (6FDA) and 32.22 g (0.1 mole) of 3,3,4,4-benzophenone-tetracarboxylic dianhydride (BTDA) were added and then reacted with stirring for 1 hour, then 21.19 g (0.098 mole) of 3,3'-dihydroxy-4,4'-diaminobiphenyl was added and stirred at room temperature further for 3 hours. Thereafter, 30 g of toluene was introduced and the temperature was increased to 150° C. to conduct imidation (cyclization) for 24 hours to obtain polyimide having OH group, then 5.88 g (0.06 mole) maleic anhydride was added and reacted at room temperature for further 3 hours to obtain a resin. Subsequently the resultant resin was poured into a large amount of methanol to precipitate out, and 112.7 g of polyimide polymer (PI-2) was produced (yield: 94.8%, IV:0.76, Td:336° C.).

Synthesis Example 3

15.215 g (0.1 mole) of 3,5-diaminobenzoic acid, 3.847 g (0,02 mole) of 1,3-di(3-aminopropyl)-1,1,3,3-tetramethyl-disiloxane (DSI) and 460 g of NMP were added into a 1 liter glass reaction flask and vigorously stirred at room temperature. Thereafter 32.22 g (0.1 mole) of 3,3,4,4-benzophenone tetracarboxylic dianhydride (BTDA) and 31.02 g (0.1 mole) of 3,3,4,4-diphenylether tetracarboxylic dianhydride were incorporated into the reaction with stirring for 1 hour, then 29.3 g (0.08 mole) of 2,2-di(3-amino-4-hydroxy-phenyl) hexafluoropropane (BAFA) were further added and stirred at room temperature for 3 hours. Subsequently 90 g of toluene was added and the temperature was increased to 150° C. to conduct imidation (cyclization) reaction for 24 hours to obtain polyimide having OH group, then 5.88 g (0.06 mole) of maleic anhydride was introduced to continue the reaction at room temperature for 3 hours to obtain a resin. Finally the resultant resin was poured into a large amount of methanol, and 111.3 g of polyimide polymer (PI-3) (yield: 92.3%, IV:0.67, Td:335° C.) was produced.

Comparative Synthesis Example 1

41.05 g (0.1 mole) of 2,2'-di(4-[4-aminophenoxy]phenyl) propane (BAPP), 9.14 g (0.06 mole) 3,5-diaminobenzoic acid (DABZ), and 350 g of NMP were introduced in an 1 liter glass reaction flask and vigorously stirred at room temperature. Thereafter 88.84 g (0.2 mole) of 2,2'-di(3,4-dicarboxylphenyl)hexafluoropropane dianhydride (6FDA) was incorporated into the reaction and stirred for 1 hour. Then 8.43 g (0.039 mole) of 3,3'-dihydroxy-4,4'-diaminobiphenyl (HAP) was added and stirred at room temperature for 3 hours. Finally 50 g of toluene was added and the temperature was increased to 150° C. for reacting for 24 hours to obtain a resin, then the resultant resin was poured into a large amount of methanol to precipitate out 137.3 g of polyimide polymer (PI-C) (yield: 93.1%, IV:0.79, Td:343° C.).

The reactants, amounts and physical data of the resultant resin in the above synthesis examples and comparative synthesis example were summarized in the following table 1:

TABLE 1

| | Synthesis Example 1 (PI-1) | Synthesis Example 2 (PI-2) | Synthesis Example 3 (PI-3) | Comparative Synthesis Example 1 (PI-C) |
|---|---|---|---|---|
| BAPP (mole) | 0.1 | | | 0.1 |
| DABZ (mole) | 0.06 | 0.1 | 0.1 | 0.06 |
| HAP (mole) | 0.039 | 0.098 | | 0.039 |
| BAFA (mole) | | | 0.08 | |
| 6FDA (mole) | 0.2 | 0.1 | | 0.2 |
| BTDA (mole) | | 0.1 | 0.1 | |
| ODPA (mole) | | | 0.1 | |
| MA (mole) | 0.04 | 0.098 | 0.06 | |
| DSI | | | 0.02 | |
| IV (intrinsic viscosity) | 0.81 | 0.76 | 0.67 | 0.79 |
| Td (95%) (° C.) | 340 | 336 | 335 | 343 |

Preparation Example 1

Preparation of Photosensitive Resist Protective Film (Coverlay)

20 g of PI-1, 0.8 g of IR651 (photoinitiator; commercial available from Ciba Geigy), 7.2 g of ethylene glycol diacrylate (M-1) and 2.8 g of triethylolpropane trimethacrylate (M-2) were dissolved in 124 g of NMP and stirred at room temperature for 3 hours to obtain a photosensitive PI glue (V-1).

The PI glue was coated on a polyethylene terephthalate (PET) substrate with a doctor knife coater (gap=100 μm), then baked at a temperature of 90° C. for 13 minutes. The baked PI film was laminated on a copper foil at a temperature of 120° C. and 1 kgf/cm pressure with a laminator. The resultant laminate was exposed (500 mJ/$cm^2$) with an ultraviolet radiation equipment through a mask having a desired pattern, then developed with 1 wt % $Na_2CO_3$ aqueous solution for 2 minutes, and dipped in pure water for rinsing; thereafter baked at 100° C. for 1 hour, 150° C. for 1 hour, 200° C. for 1 hour, and 250° C. for 2 hours in sequence. Upon observation with a magnifier and a scanning electron microscope, the resultant photoresist pattern showed a circuit pattern with 100/100 μm resolution/adherence.

Solubility Test:

The resultant polyimide was cast into a film and a specimen having the dimension of 9*5.5 $cm^2$ cut from the film was dissolved in 1000 ml 1 wt % of $Na_2CO_3$ aqueous solution. If the specimen dissolved completely within 2 minutes, it was rated as "good" solubility; if any un-dissolved parts remained, it was rated as "bad" solubility.

Preparation Example 2

Preparation of Photosensitive Resist Protective Film 20 g of PI-2, 0.75 g of IR907 (a trade name of Ciba Geigy: 2-methyl-1-[4-(methylthio)phenyl]-2-morpholinyl-propan-1-one), 0.15 g of ITX (2-isopropylthioxanthone), 6 g of ethylene glycol diacrylate (M-1), 3.5 g of triethylolpropane trimethacrylate (M-2), and 2.5 g of pentaerythritol diacrylate (M-3) were dissolved in 130 g of NMP and stirred at room temperature for 3 hours to obtain photosensitive resist PI glue (V-2).

The resultant photosensitive resist PI glue (V-2) was produced into a protective film and its $Na_2CO_3$ aqueous solution solubility test was also tested by the same manner as in Preparation Example 1

Preparation Example 3

Preparation of Photosensitive Resist Protective Film 20 g of PI-3, 0.53 g of IR907, 0.2 g of ITX, 3.5 g of ethylene glycol diacrylate (M-1), pentaerythritol diacrylate (M-3) and 2.1 g of isocyanuric tri(ethyl acrylate) (M-4) were dissolved in 119 g of NMP and stirred at room temperature for 3 hours to obtain a photosensitive resist PI glue (V-3).

The resultant photosensitive resist PI glue (V-3) was produced into a protective film and its $Na_2CO_3$ aqueous solution solubility test was also tested by the same manner as in Preparation Example 1

Comparative Preparation Example 1

Preparation of Photosensitive Resist Protective Film 20 g of PI-C, 0.8 g of IR651 (2,2-dimethoxy-2-phenylacetophenone; commercial available from Ciba Geigy), 7.2 g of ethylene glycol (M-1) and 2.8 g of triethylolpropane trimethacrylate (M-2) were dissolved in 124 g of NMP and stirred at room temperature for 3 hours to procure a photosensitive resist PI glue (V-C).

The resultant photosensitive resist PI glue (V-C) was produced into a protective film and its $Na_2CO_3$ aqueous solution solubility test was also tested by the same manner as in Preparation Example 1

The composition and the solubility test results of the photosensitive resist protective films were summarized in the following Table 2:

TABLE 2

| Components (g) | Preparation Example 1 (V-1) | Preparation Example 2 (V-2) | Preparation Example 3 (V-3) | Comparative Preparation Example 1 (V-C) |
|---|---|---|---|---|
| Resin | PI-1 (100) | PI-2 (100) | PI-3 (100) | PI-C (100) |
| IR651 | 4.0 | | | 4.0 |
| IR907 | | 3.75 | 2.65 | |
| ITX | | 0.75 | 1.0 | |
| M-1 | 36.0 | 30.0 | 17.5 | 36.0 |
| M-2 | 14.0 | 17.5 | | 14.0 |
| M-3 | | 12.5 | 17.0 | |
| M-4 | | | 10.5 | |
| Resolution | 100/100 μm | 80/100 μm | 100/100 μm | 200/250 μm |
| Reduction rate of film thickness (%) | ~11% | ~7% | ~8% | ~10% |
| Solubility in $Na_2CO_3$ aqueous solution | Good | good | good | bad |

As known from the above table, the photosensitive polyimide polymer shows an excellent solubility in an aqueous alkaline solution due to acidic groups and photosensitive functional groups linked in the main chain. In addition, since the photosensitive functional group is directly linked on the main chain, the present resin shows a higher Td. Also, when the resin is formed into a film, the film after exposing and baking will not severely shrink in thickness.

What is claimed is:

1. A water soluble photosensitive polyimide polymer which is characterized in that it possesses the repeat units represented by formula (I):

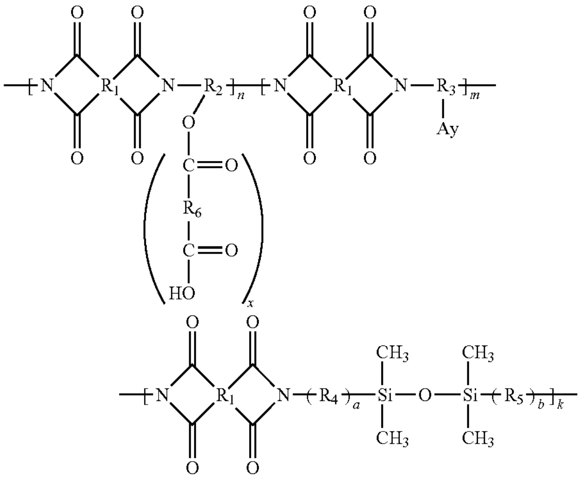

-continued

[wherein $R_6$ = $-CR_7{=}CR_8-$, 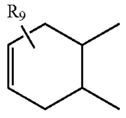 or 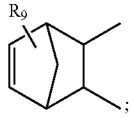;

$R_1$ represents a tetra-valence organic group having 4 or more carbon atoms; $R_2$ is a three- or tetra-valence organic group, which is optionally substituted with carboxyl group; $R_3$ represents a two- to tetra-valence organic group; A represents OH or COOH group; $R_4$ and $R_5$ are the same or different, each represents an alkylene group having 1~6 carbon atoms, an arylene group, arylalkylene group, arylene-oxy-alkylene group having 6~20 carbon atoms; $R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms; x represents an integer of 1 or 2; y represents an integer of 0, 1 or 2; a, b and n each represents an integer equal to or greater than 1; m and k each represents an integer equal to or greater than 0]; wherein the above repeating units are in random or block arrangement.

2. The water soluble photosensitive polyimide polymer according to claim 1, wherein the polyimide polymer has a weight average molecular weight of from 10,000 to 300,000, an intrinsic viscosity of from 0.20 to 0.95, a 5% thermal weight loss temperature (Td(95%)) of not less than 260° C.

3. The water soluble photosensitive polyimide polymer according to claim 1, wherein when said water soluble photosensitive polyimide polymer is cast into a film having a thickness of 10~25 μm, the film with a dimension of 9 cm×5.5 cm is dissolved in 1000 ml 1 wt % of aqueous sodium carbonate solution within 2 minutes.

4. A process for producing water soluble photosensitive polyimide polymer having repeating units represented by formula (I):

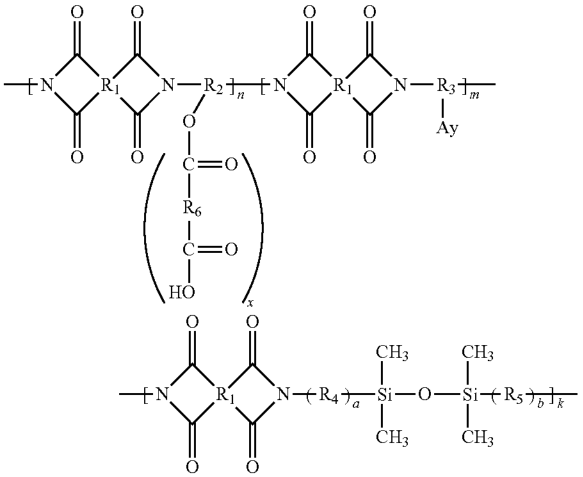

wherein $R_6$ = $-CR_7{=}CR_8-$, 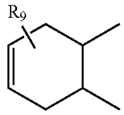 or 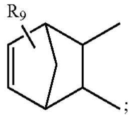;

$R_1$ represents a tetra-valence organic group having 4 or more carbon atoms; $R_2$ is a three- or tetra-valence organic group, which is optionally substituted with carboxyl group; $R_3$ represents a two- to tetra-valence organic group; A represents OH or COOH group; $R_4$ and $R_5$ are the same or different, each represents an alkylene group having 1~6 carbon atoms, an arylene group, arylalkylene group, arylene-oxy-alkylene group having 6~20 carbon atoms; $R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms; x represents an integer of 1 or 2; y represents an integer of 0, 1 or 2; a, b and n each represents an integer equal to or greater than 1; m and k each represents an integer equal to or greater than 0]; wherein the above repeating units are in random or block arrangement;

the process comprises the following steps:

(a) reacting a tetra-carboxyl acid dianhydride with a diamine having carboxyl and/or hydroxyl functional groups to obtain a polyamic acid precursor having carboxyl and/or hydroxyl functional groups in the main chain; wherein the molar ratio of tetra-carboxyl acid dianhydride: diamine is 1:0.8~1:1.2;

(b) heating and subjecting the polyamic acid precursor having carboxyl and/or hydroxyl functional groups in the main chain obtained from step (a) to cyclization to obtain a polyimide having carboxyl and/or hydroxyl functional groups in the main chain; and (c) reacting the polyimide having carboxyl and/or hydroxyl functional groups in the main chain obtained from step (b) with a dianhydride of the following formula (II) to subject to open-ring reaction:

(II)

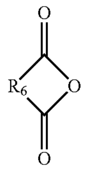

(wherein, $R_6$ = $-CR_7{=}CR_8-$, 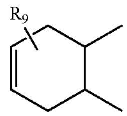 or 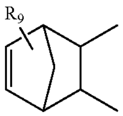

$R_7$ and $R_8$ are the same or different, each represents the group selected from a hydrogen, a halogen, a carboxyl, a linear or cyclic alkyl having 1~20 carbon atoms, an aryl, alkylaryl, and arylalkyl having 6~20 carbon atoms; $R_9$ represents a hydrogen atom or an alkyl group having 1-6 carbon atoms);

to produce a polyimide polymer having repeating unit which has acrylic acid group in the main chain, as shown in the above general formula (I).

5. The process according to claim 4, wherein the diamine having carboxyl and/or hydroxyl functional groups used in step (a) is a diamine having both hydroxyl and carboxyl functional groups.

6. The process according to claim 4, wherein the diamine having carboxyl and/or hydroxyl functional groups used in step (a) is partially replaced by a diamine having siloxane functional groups.

7. The process according to claim 6, wherein the diamine having siloxane functional groups comprises 5~60 mole % of the total diamine.

8. The process according to claim 7, wherein the diamine having siloxane functional groups is at least one selected from the group consisting of 1,3-di(3-aminopropyl)-1,1,3,3-tetramethyl-disiloxane (DSI), 1,3-di(4-aminobutyl)-1,1,3,3-tetramethyldisiloxane, 1,3-di(3-aminopropyl)-1,3-dimethyl-1,3-diphenyldisiloxane, 1,3-di(3-amino-phenyl)-1,1,3,3-tetramethyldisiloxane, 1,3-di(4-aminophenyl)-1,1,3,3-tetramethyldisiloxane, 1,3-di(3-aminophenoxymethyl)-1,1,3,3-tetramethyldisiloxane, and 1,3-di(4-aminophenoxymethyl)-1,1,3,3-tetramethyldisiloxane.

9. A water soluble photosensitive polyimide resin composition, which comprised (A) a water soluble photosensitive polyimide polymer having repeat units represented by formula (I) according to claim 1; (B) a (meth)acrylic acid monomer diluent and (C) a photo-initiator; wherein the weight ratio of component (A): component (B) is 100:10~200, and the amount of component (C) is 0.1~15.0% relative to 100% by weight of component (A).

* * * * *